(12) United States Patent
Chen et al.

(10) Patent No.: US 7,181,838 B2
(45) Date of Patent: Feb. 27, 2007

(54) METHOD OF FABRICATING IDENTIFIABLE FLEXIBLE PRINTED CIRCUIT BOARD

(75) Inventors: Chih-Ching Chen, Taipei (TW); Yi-Jing Leu, Hsinchu (TW)

(73) Assignee: Benq Corporation, Taoyuan (TW)

( * ) Notice: Subject to any disclaimer, the term of this patent is extended or adjusted under 35 U.S.C. 154(b) by 173 days.

(21) Appl. No.: 10/965,888

(22) Filed: Oct. 18, 2004

(65) Prior Publication Data

US 2005/0052512 A1 Mar. 10, 2005

Related U.S. Application Data

(62) Division of application No. 10/253,545, filed on Sep. 25, 2002, now Pat. No. 7,138,171.

(30) Foreign Application Priority Data

Sep. 25, 2001 (TW) ............... 90123656 A

(51) Int. Cl.
*H05K 3/02* (2006.01)
*H05K 3/10* (2006.01)
(52) U.S. Cl. ............... 29/847; 29/846; 29/DIG. 16; 29/829; 216/48; 216/50; 430/313; 430/318
(58) Field of Classification Search .......... 29/847, 29/846, 831, DIG. 16, 825, 829, 890.1; 216/42, 216/44, 48, 50; 430/313, 318; 428/195.1, 428/473.5, 474.4, 901; 427/282
See application file for complete search history.

(56) References Cited

U.S. PATENT DOCUMENTS

| | | | | |
|---|---|---|---|---|
| 3,231,374 A | * | 1/1966 | Sciambi | ............ 216/48 X |
| 4,064,287 A | * | 12/1977 | Lipson et al. | ....... 427/282 X |
| 4,158,566 A | * | 6/1979 | Goldman | ............ 430/318 |
| 4,389,278 A | * | 6/1983 | Kai | ............ 216/48 X |
| 4,575,399 A | * | 3/1986 | Tanaka et al. | ....... 216/48 X |
| 5,748,209 A | | 5/1998 | Chapman et al. | |
| 6,161,915 A | | 12/2000 | Bolash et al. | |

FOREIGN PATENT DOCUMENTS

| | | | | |
|---|---|---|---|---|
| CN | 2483937 Y | 3/2002 | | |
| DE | 4240141 | 6/1994 | | |
| EP | 0157374 | 10/1985 | | |
| JP | 55-122876 | * | 9/1980 | ........ 216/48 |
| JP | 60-84884 | * | 5/1985 | ........ 216/48 X |
| JP | 04340295 | 11/1992 | | |
| JP | 2000-208898 A | 7/2000 | | |

* cited by examiner

*Primary Examiner*—A. Dexter Tugbang
(74) *Attorney, Agent, or Firm*—Rabin & Berdo, P.C.

(57) ABSTRACT

A method of fabricating identifiable flexible printed circuit board (PCB) disposed to an inkjet cartridge includes, providing a flexible substrate having a first surface. A conductive layer is formed on the first surface. A printing ink layer is coated over the first surface. The printing ink layer is exposed and developed to uncover parts of the conductive layer and form at least one identifiable area on the printing ink layer.

14 Claims, 8 Drawing Sheets ments, color pictures, and photos. Generally, in the inkjet printer for color printing two cartridges are used. One is the black cartridge stored black ink, and the other is the color cartridge stored color ink. A flexible printed circuit board (PCB) disposeda to the cartridge serves as a medium to lead the driving current to the printhead chip. After receiving the driving current, the printhead chip makes the cartridge to expel ink. Also, the flexible PCB comprises numerous holes, and the dimples of the printer circuit electrically contact with the conductive traces of the flexible PCB through the holes.

METHOD OF FABRICATING IDENTIFIABLE FLEXIBLE PRINTED CIRCUIT BOARD

This is a Divisional of U.S. application Ser. No. 10/253,545, filed Sep. 25, 2002 now U.S. Pat. No. 7,138,171.

This application incorporates by reference of Taiwan application Serial No. 90123656, filed Sep. 25, 2001.

BACKGROUND OF THE INVENTION

1. Field of the Invention

The invention relates in general to a flexible printed circuit board (PCB) and the method of fabricating the same, and more particularly to an identifiable flexible PCB and a method of fabricating the same.

2. Description of the Related Art

The computer printer, particularly the color inkjet printer, has become a necessity in the modern life. It can be used for printing out the desired information such as docu- In the commercial inkjet printer market, there are some color-separate inkjet cartridges filled with black ink or color ink, such as cyan, magenta, yellow, light black, light cyan, light magenta, and light yellow inks. However, the colors of the related flexible PCBs are the same, and the other features such as the size, shape, and the pattern of conductive trace are very similar. It is difficult for the on-line operators to assemble the right flexible PCBs to the corresponding cartridges. To increase the assembly speed and accuracy, identifiable marks, such as a brand name or trademark, serial number, or tape specification, are printed on the flexible PCBs for identification. For example, the brand name or trademark provides identification for the manufactures and consumers. The serial number or tape specification provides identification for the on-line operators during assembling. Nevertheless, the extra printing procedure required in the fabrication process will increase the production cost. Also, the identifiable marks printed on the flexible PCBs could fade or peel off if exposed to a humid environment during a long period of time. Thus, printing the identifiable mark on the flexible PCB is not an economical and practical solution.

The flexible PCB is commonly fabricated by tape automated bonding (TAB) technique. Etching and punching are two typical TAB manufacturing processes. Etching process is characterized by etching the tape while the punching process is characterized by punching the tape to form the holes of the flexible PCB. The details are illustrated in the following description.

FIG. 1A~FIG. 1J illustrate the conventional etching process for forming the holes of the flexible printed circuit board. First, a substrate 102 such as the material of polyimide (PI) is provided, as shown in FIG. 1A. A copper film 104 is then formed over the substrate 102 by sputtering, as shown in FIG. 1B. Two layers of photo-resist (PR) 106 are formed respectively on the bottom side of the substrate 102 and over the copper film 104, as shown in FIG. 1C. After exposing (FIG. 1D) and developing (FIG. 1E) the two layers of PR 106, the predetermined patterns of the holes and the conductive traces are defined. Next, a copper layer 108 is plated on the exposed copper film 104, and the copper layer 108 and the copper film 104 are integrated as a whole, as shown in FIG. 1F. Then, the substrate 102 is partially etched to form the holes 110, as shown is FIG. 1G. The remaining photo-resist 106 on the both sides are then removed, as shown in FIG. 1H. The copper layer 108 and the copper film 104 are exposed to air, and several gaps 109 are formed on the copper layer 108.

Then, the portion of the copper film 104 not covered by the copper layer 108 is removed by photolithography through the steps of coating a layer of PR, exposing, developing and etching. The conductive traces 111 are therefore formed by the combination of the remaining copper film 104 and the copper layer 108, as shown in FIG. 1I. Finally, the conductive trace 111 is enclosed by an insulation layer 112 for the purpose of protection, and the flexible PCB 114 is finished as shown in FIG. 1J. The conventional etching process has several drawbacks, including large time-consumption and low yield rate (high proportion of low-quality product). Also, it produces a sticky precipitate and discharges large amounts of wastewater during etching process. The cost of wastewater treatment is a considerable issue.

FIG. 2A~FIG. 2I illustrate the conventional punching process for forming the holes of the flexible printed circuit board. First, a substrate 202 is provided (FIG. 2A), and an adhesive layer 204 is coated thereon, as shown in FIG. 2B. Then, the substrate 202 coated with the adhesive layer 204 is punched by the punching tool to form several holes 206, as shown in FIG. 2C. A copper layer 208 is further attached over the adhesive layer 204, as shown in FIG. 2D. Next, a photo-resist layer 210 is formed on the copper layer 208, followed by exposure and development. Numerous gaps 211 are created so as to expose parts of the copper layer 208 to the air, as shown in FIG. 2G. Then, portions of the copper layer 208 not covered by the PR layer 210 are etched, as shown in FIG. 2H.

Afterward, the remaining PR layer 210 is removed, and the discrete copper layer 208 (FIG. 2I) therefore forms the conductive traces. Finally, the conductive trace is enclosed by an insulation layer 212 for the purpose of protection, and then the flexible PCB 214 is completed as shown in FIG. 2I. Compared with the etching process mentioned above, the punching process is a short-term procedure requiring less cost and no wastewater treatment. However, the interval between adjacent holes is too wide to form a large number of holes of the flexible PCB. Consequently the contact area between the printer and the flexible PCB is decreased, and dramatically affects the precision of contact. Furthermore, the punching step could easily cause the breakage of the substrate, thus reducing the yield rate and increasing the cost of production.

SUMMARY OF THE INVENTION

It is therefore an object of the invention to provide an identifiable flexible printed circuit board (PCB) and a method of fabricating the same. At least one color is presented on the flexible PCB for the purpose of identification, so that the on-line operators can easily and correctly assemble the color flexible PCB to the corresponding cartridge. Also, an identifiable mark such as the trademark, brand name and serial number can be further patterned and formed on the printing ink layer of the flexible PCB during fabrication. Without the conventional printing step, the cost is saved and the identifiable mark does not easily peel off.

It is an object of the invention to provide an identifiable flexible PCB of the invention assembled to an inkjet cartridge. The flexible PCB comprises a flexible substrate, a conductive layer, and a printing ink layer. The flexible substrate has a surface on which the conductive layer is formed. The printing ink layer is formed on the surface of the flexible substrate by coating. After exposing and developing the printing ink layer, parts of the conductive layer are uncovered to form the conductive traces of the flexible PCB. Furthermore, at least one identifiable area is formed on the printing ink layer for the purpose of identification.

It is another object of the invention to provide a method of fabricating the identifiable flexible PCB assembled to an inkjet cartridge. First, a flexible substrate having a first surface is provided. Next, a conductive layer is formed on the first surface of the flexible substrate. Then, a printing ink layer is coated on the first surface of the flexible substrate, followed by exposing and developing the printing ink layer to uncover parts of the conductive layer. Also, at least one identifiable area is formed on the printing ink layer for the purpose of identification.

Other objects, features, and advantages of the invention will become apparent from the following detailed description of the preferred but non-limiting embodiments. The following description is made with reference to the accompanying drawings.

DETAILED DESCRIPTION OF THE INVENTION

In the present invention, an identifiable flexible printed circuit board (PCB) disposed in the ink jet cartridge is disclosed. An identifiable area is formed in the flexible PCB during the fabrication process. According to the invention, at least one colorant is added in the printing ink layer of the flexible PCB to present color in the identifiable area, so that the on-line operators can easily and correctly assemble the color flexible PCB to the corresponding cartridge. Also, identifiable marks such as the trademark, brand name of a company, serial number, and tape specification can be further formed on the printing ink layer of the flexible PCB, thereby eliminating the extra steps of process for printing the marks on the flexible PCB. The PCB of the invention is not only easy to identify, but also cost saving. The detail structure and process of fabricating the identifiable flexible PCB are described below.

Figure 1A:
FIG. 1A~FIG. 1J (Prior Art) illustrate the conventional etching process for forming the holes of the flexible printed circuit board.
Figure 1B:
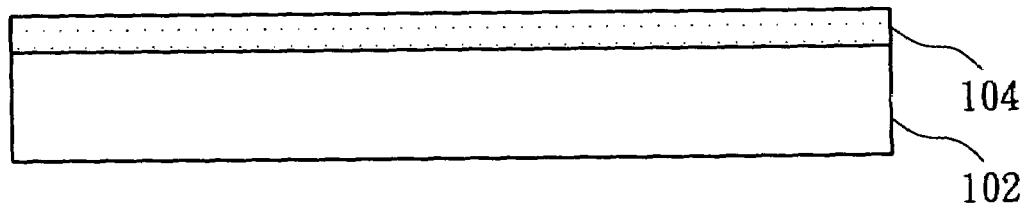
Figure 1C:
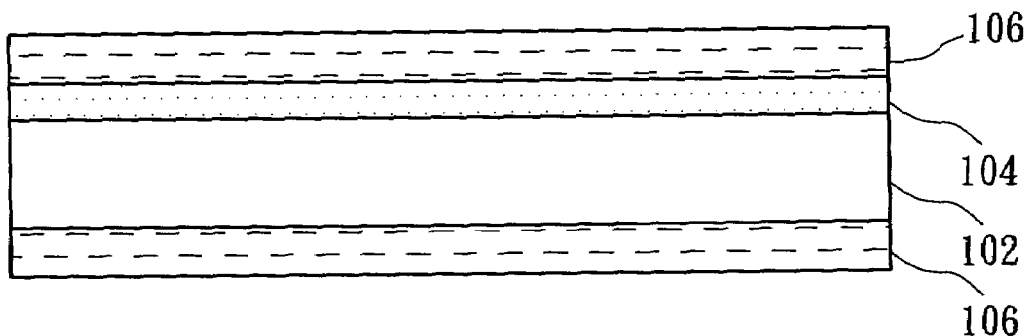
Figure 1D:
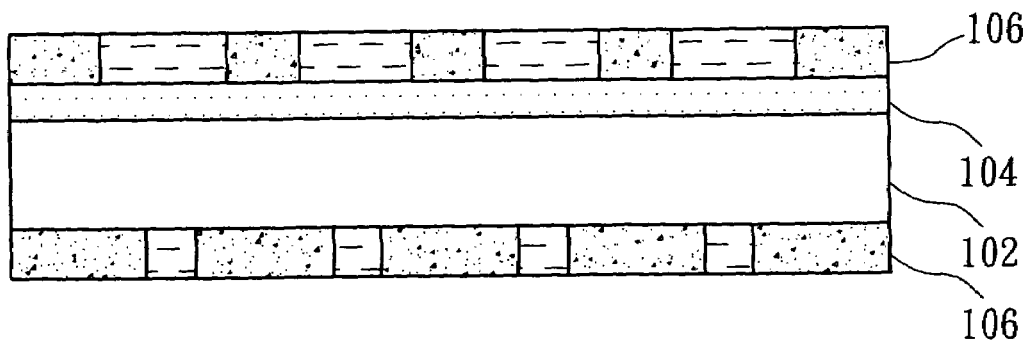
Figure 1E:
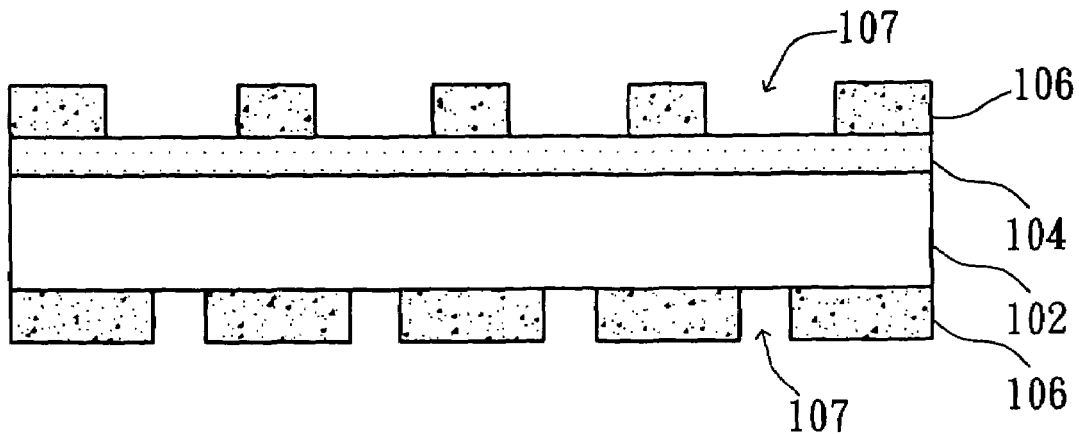
Figure 1F:
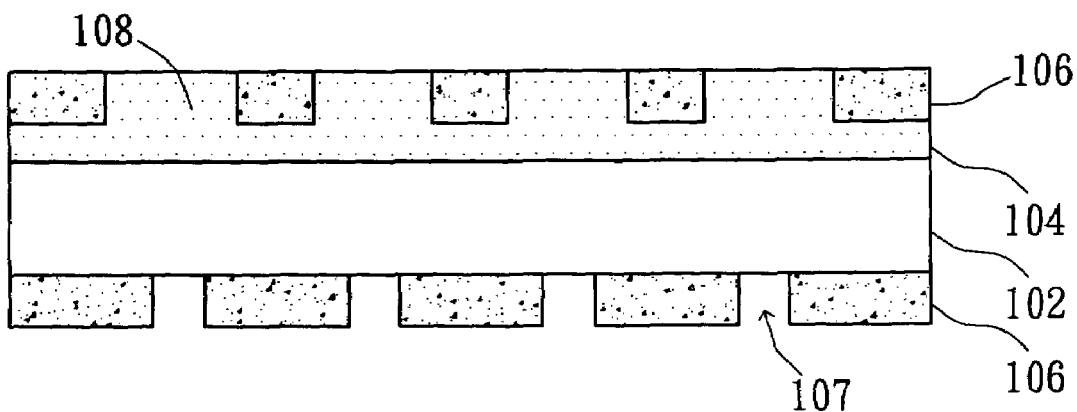
Figure 1G:
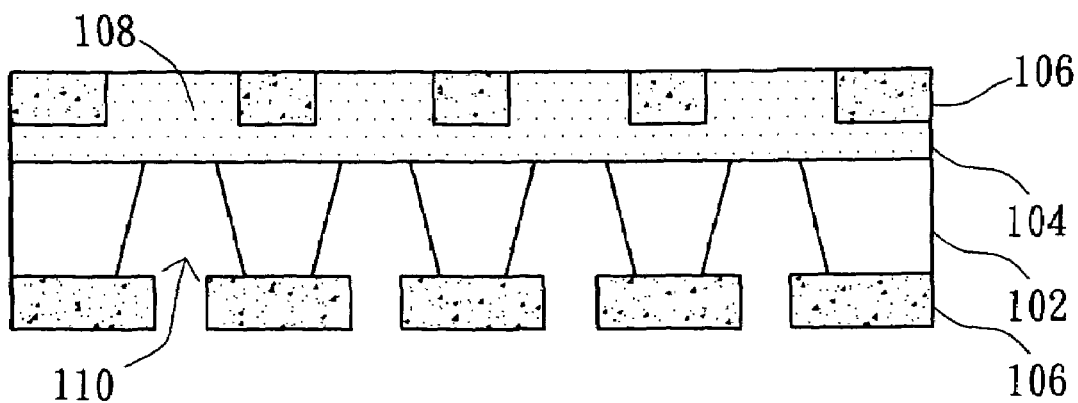
Figure 1H:
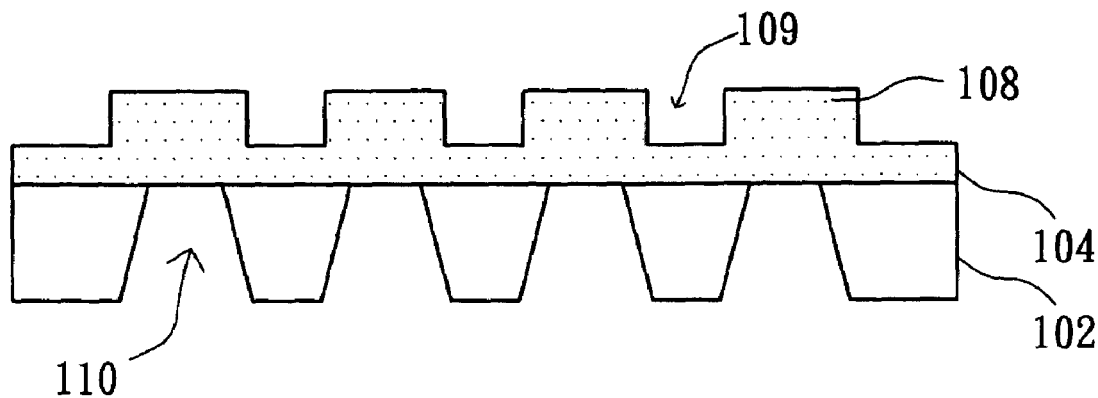
Figure 1I:
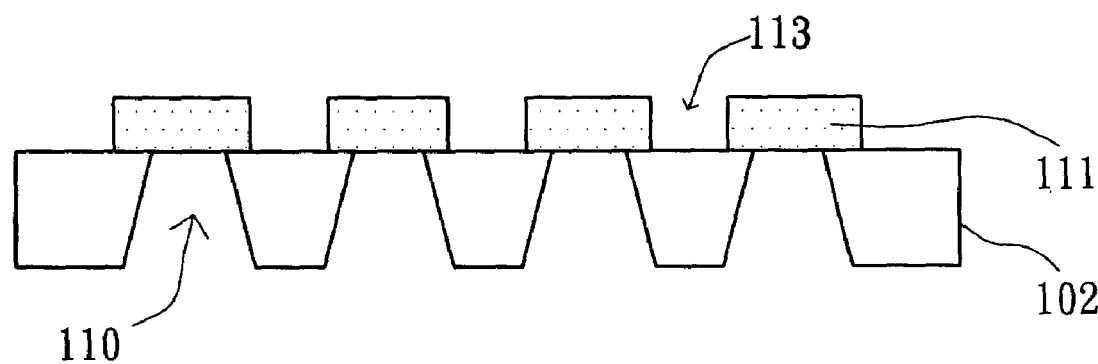
Figure 1J:
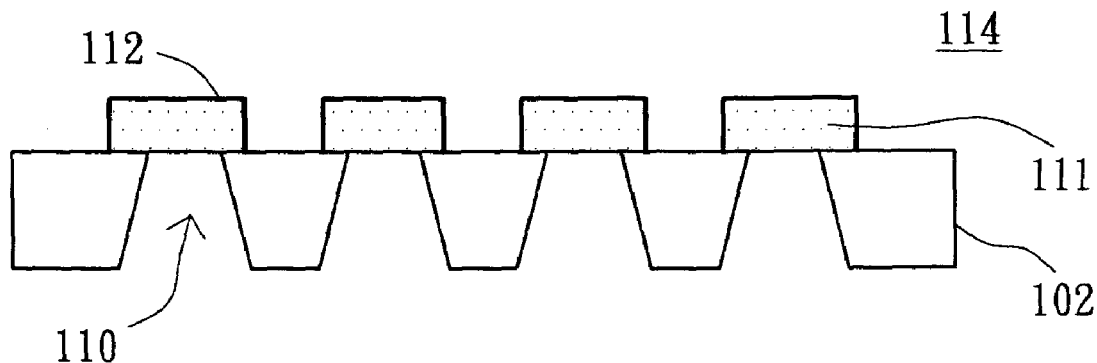
Figure 2A:
FIG. 2A~FIG. 2I (Prior Art) illustrate the conventional punching process for forming the holes of the flexible printed circuit board.
Figure 2B:
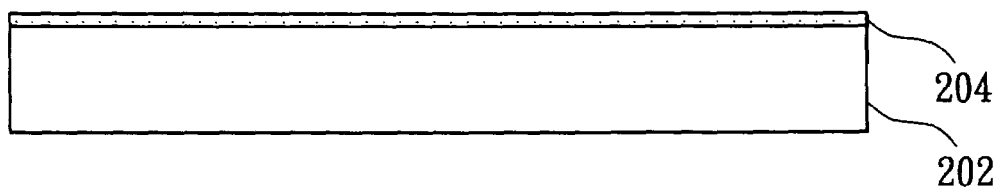
Figure 2C:
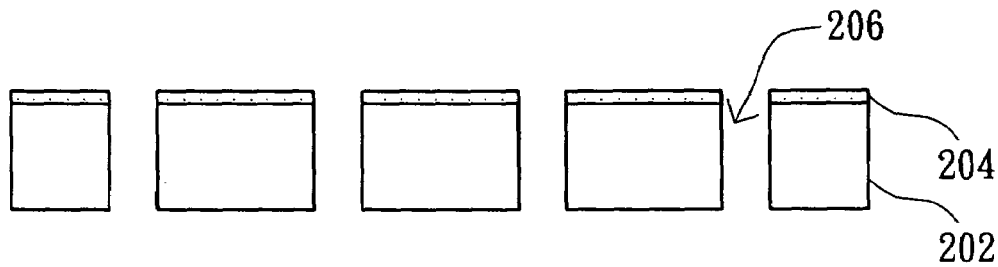
Figure 2D:
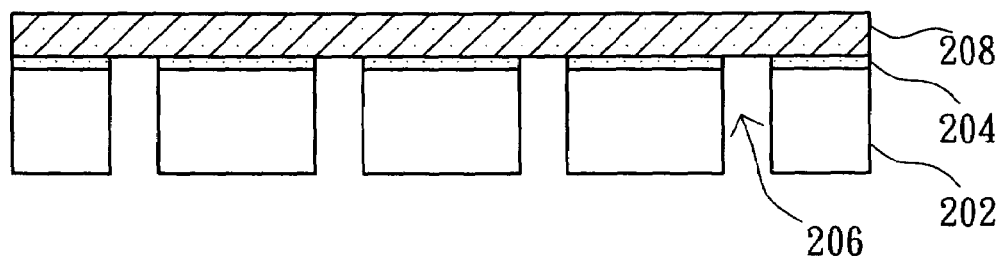
Figure 2E:
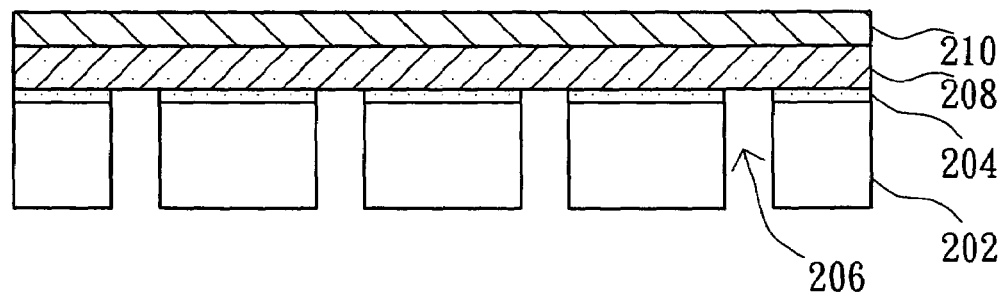
Figure 2F:
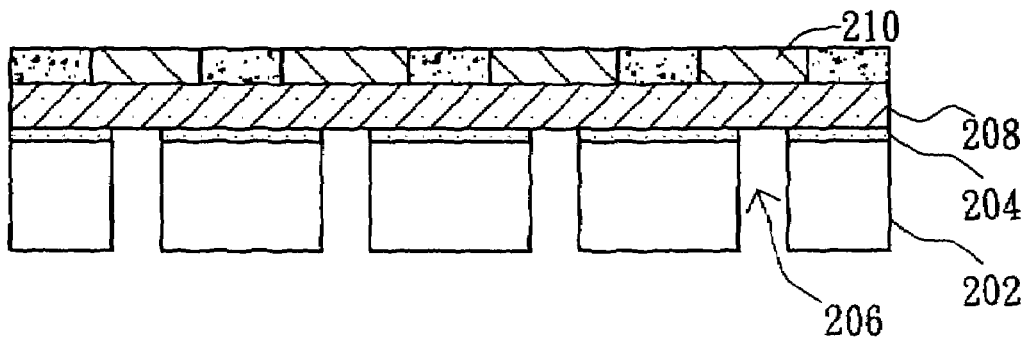
Figure 2G:
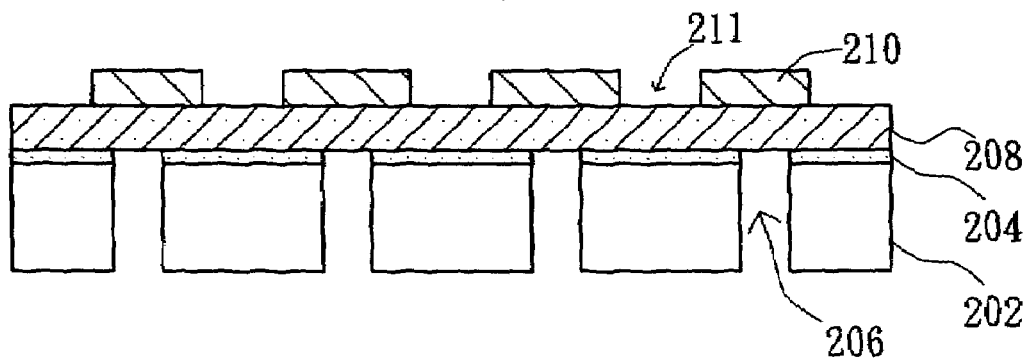
Figure 2H:
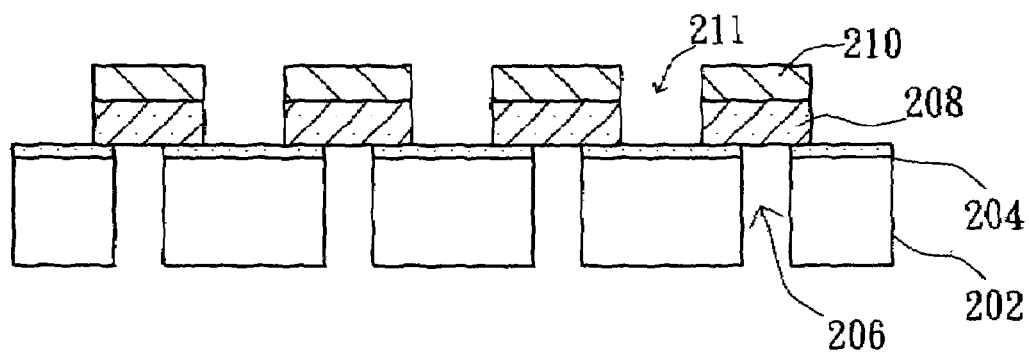
Figure 2I:
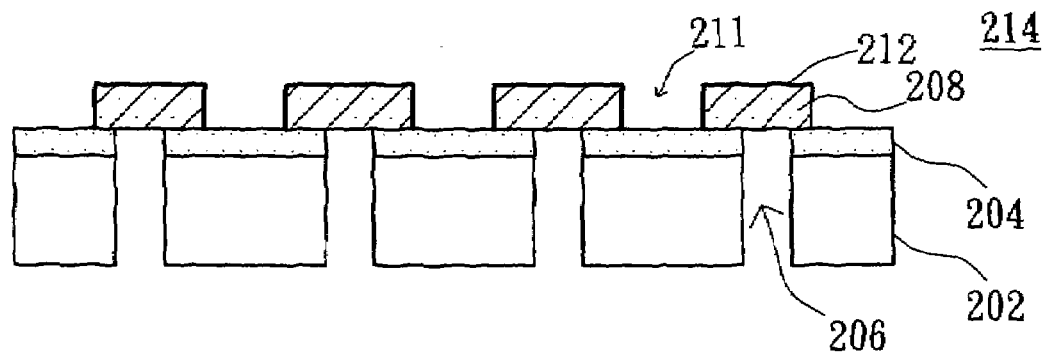
Figure 3A:
FIG. 3A~FIG. 3J illustrate the process of fabricating the identifiable flexible printed circuit board according to a preferred embodiment of the invention.

FIG. 3A~FIG. 3J illustrate the process of fabricating the identifiable flexible printed circuit board of the invention. First, a flexible substrate 302 such as polyimide (PI) is provided, as shown in FIG. 3A. In addition to polyimide, the material of the flexible substrate 302 can be other polymer film such as Teflon, polyamide, polymethylmethacrylate, polycarbonate, polyester, polyamide polyethylene-terephthalate copolymer, or any combination of the above materials.

Figure 3B:
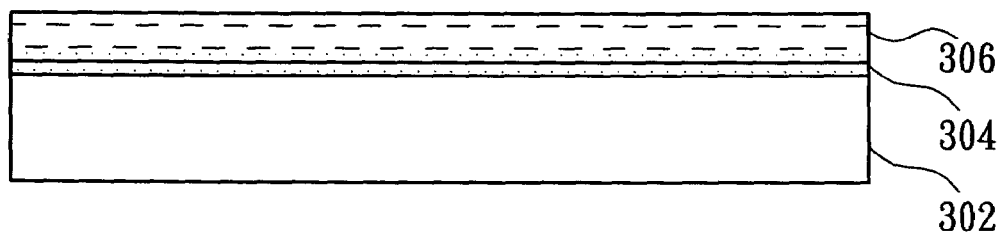
Figure 3C:
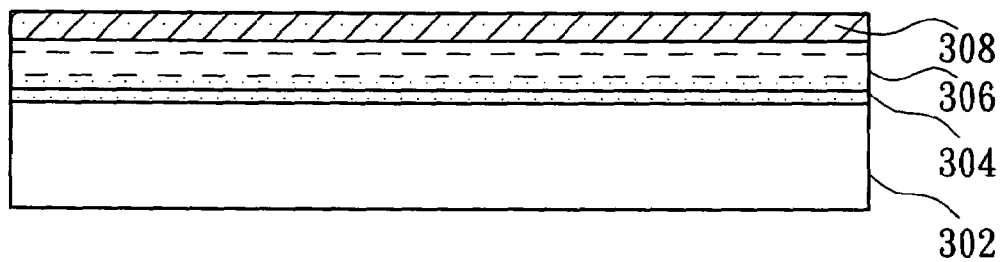
Figure 3D:
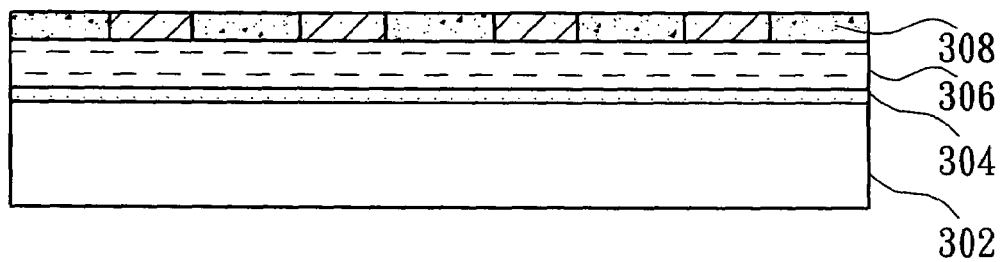
Figure 3E:
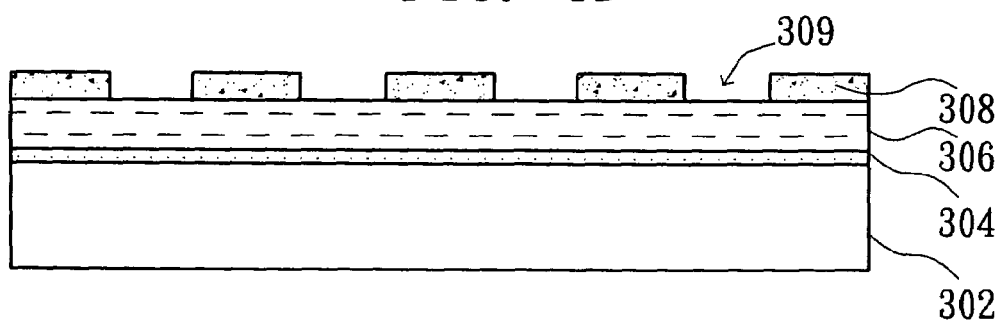
Figure 3F:
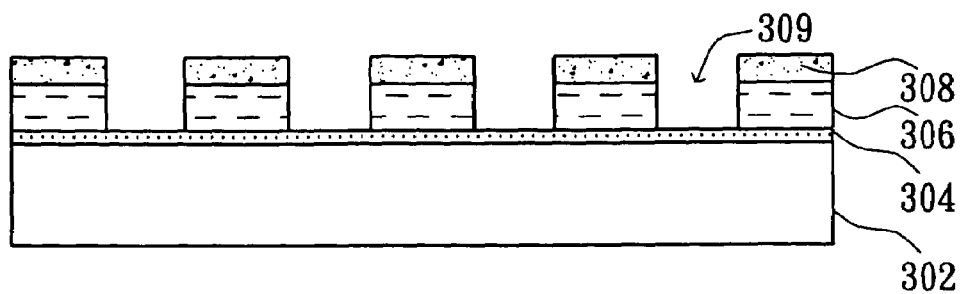
Figure 3G:
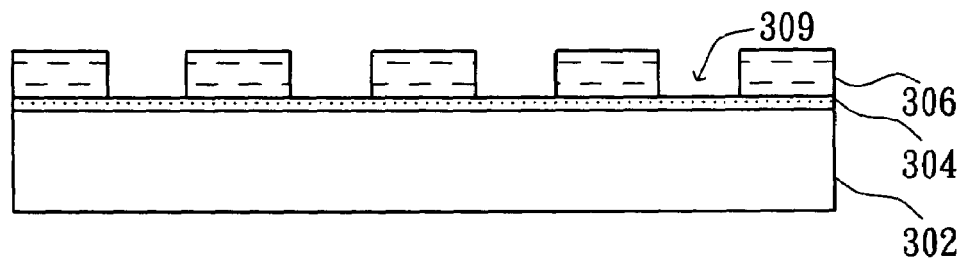

Next, a conductive layer 306 is attached to the top surface of the flexible substrate 302 through an adhesive layer 304, as shown in FIG. 3B. The material of the conductive layer 306 can be a roll of copper foil or gold foil, and is attached to the flexible substrate 302 to form the conductive traces. The copper foil or the gold foil is preferably about 10 µm to 50 µm thick. Then, a photo-resist (PR) layer 308 is formed over the conductive layer 306, as shown in FIG. 3C. After exposing (FIG. 3D) and developing (FIG. 3E) the PR layer 308, the predetermined pattern of the conductive traces is defined. In FIG. 3E, several gaps 309 are created between the discrete PR layer 308, so as to expose portions of the conductive layer 306 to air. The conductive layer 306 not covered by the PR layer 308 is etched, resulting in the formation of deeper gaps 309 and the exposure of a partial adhesive layer 304 to the air, as shown in FIG. 3F. Then, the remaining PR layer 308 is removed, and the conductive layer 306 formed as the predetermined pattern is exposed to the air, as shown in FIG. 3G.

Figure 3H:
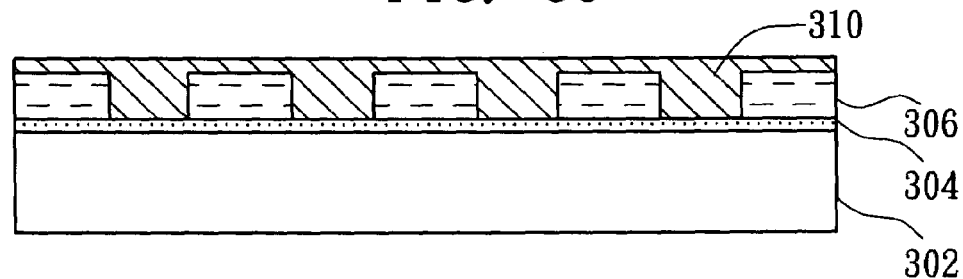

Next is the critical step to coat a printing ink layer 310 over the top surface of the flexible substrate 302. The printing ink layer 310 cover not only the adhesive layer 304 but also the conductive layer 306, as shown in FIG. 3H. The printing ink layer 310 could be coated by screening printing, spray coating, curtain coating, or roller coating.

The colorants added in the printing ink layer 310 could be the same color as inkjet ink, such as black, cyan, magenta, yellow, light black, light cyan, light magenta, and light yellow. Also, they could be the other colors irrelevant to inkjet ink, such as orange, green, light orange, and light green. Furthermore, the preferred material of the printing ink layer 310 is a liquid photo imagerable polymer, such as liquid photo imagerable solder mask (LPSM) or polyimide (PI). After exposure to light, the LPSM is cross-linked and the strengthened structure does not dissolved in the developer. The other photo-resist such as polyimide (PI) functions the same as LPSM.

Figure 3I:
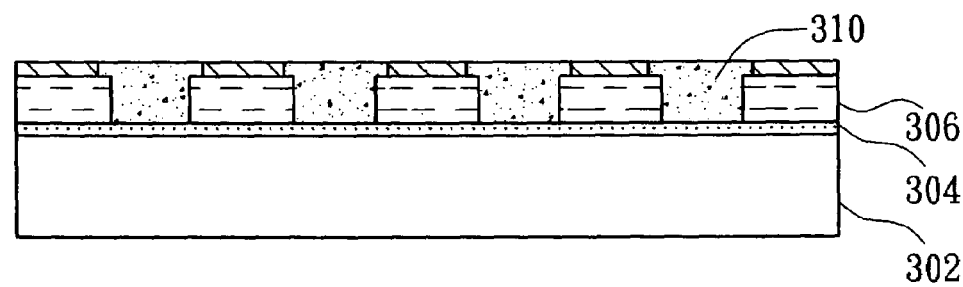
Figure 3J:
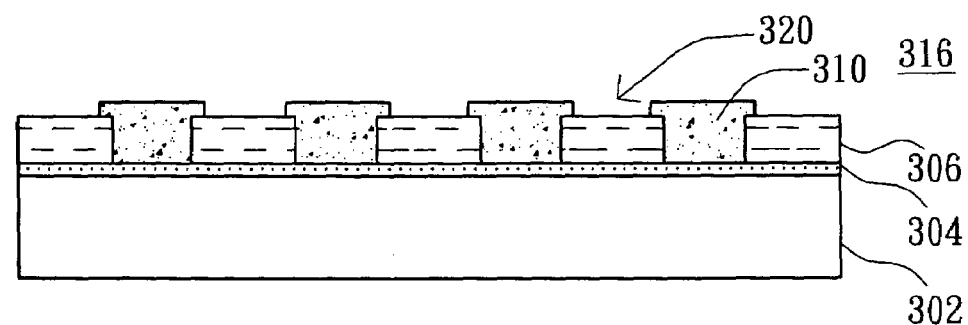

Next, after exposing the printing ink layer 310, a predetermined pattern is formed thereon, as shown in FIG. 3I. The predetermined pattern of the printing ink layer 310 could be any identifiable mark, such as trademark, brand name of the manufacture, or the serial number. The user can know the product type according to the identifiable mark on the flexible PCB. Compared to the traditional method that requires an extra procedure for printing the identifiable mark, the process of the invention integrating the formation of mark into the printing ink layer 310 can prevent the mark from peeling off. Afterward, the partial printing ink layer 310 is removed by developing. As shown in FIG. 3J, several holes 320 are formed between the discrete blocks of the printing ink layer 310, resulting in the exposure of the conductive layer 306. The dimples of the printer circuit electrically contact with the conductive traces (on the conductive layer) of the flexible PCB 316 through the holes 320. Then, the remaining printing ink layer 310 is hardened by post-curing, and the fabrication of the flexible PCB 316 of the invention is completed.

In the description above, the holes 320 of the flexible substrate 302 are not formed by punching. Therefore, the fabricating method of manufacturing the flexible PCB has several advantages; for example, the cycle time is shortened, the resolution of the printer is increased, and the yield rate is raised to about 99%. Accordingly, the invention is very suitable for a mass-production scale.

Figure 4:
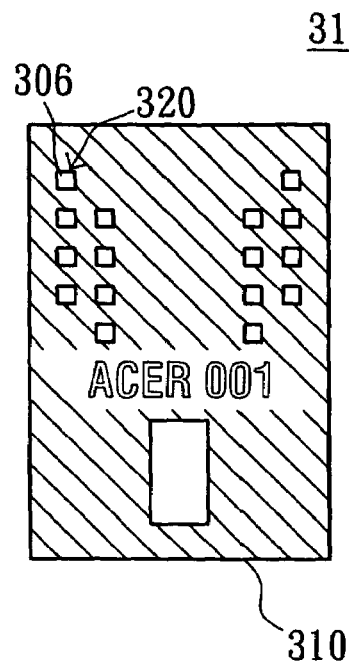
FIG. 4 is a top view of the flexible PCB of the invention, with the predetermined pattern is formed on the entire printing ink layer.

FIG. 4 is a top view of the flexible PCB of the invention, which has the predetermined pattern formed on the entire printing ink layer. The flexible PCB 316 includes the conductive layer 306 and the printing ink layer 310. For contacting the dimples of the printer circuit, the conductive layer 306 is exposed to the air through the holes 320. In FIG. 4, a colorant, such as red colorant, is added to dye the entire printing ink layer 310 during fabrication. This red flexible PCB can be correctly assembled to the cartridge containing red ink. Also, a trademark (such as "ACER") and serial number (such as "001") can be further formed on the printing ink layer 310.

Figure 5:
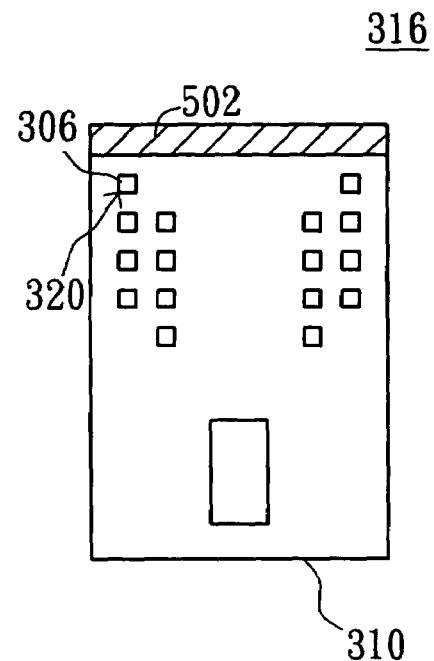
FIG. 5 is a top view of another flexible PCB of the invention, which has a single color presented on parts of the printing ink layer.

It is noted that the colorant is added for the purpose of identification. Thus, the presented color area on the printing ink layer 310 is not limited but identifiable. FIG. 5 is a top view of another flexible PCB of the invention, which has a single color presented on parts of the printing ink layer. In FIG. 5, an identifiable area 502 is formed in the upper end of the printing ink layer 310 to present the color (such as a red color). The identifiable area 502 could be enlarged and identical to the size of the entire printing ink layer 310, as shown in FIG. 4. The colorant is added in the liquid photo imagerable polymer and coated on the portion of the printing ink layer 310 corresponding to the identifiable area 502, and then exposed, developed, and followed by post-curing to harden the rest of the printing ink layer 310. Also, the trademark and serial number could be formed on the identifiable area 502 of FIG. 5.

Figure 6:
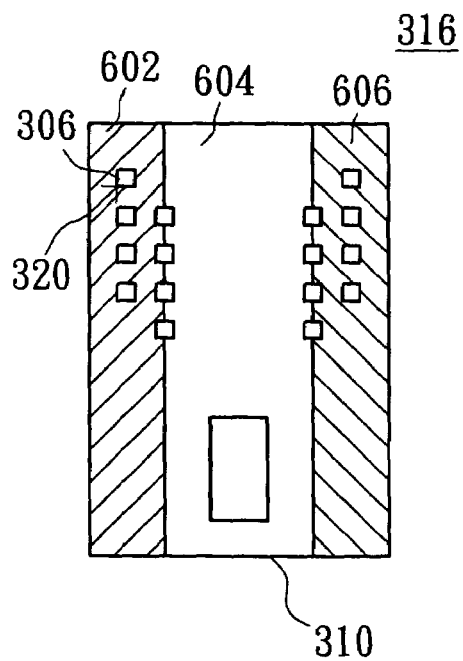
FIG. 6 is a top view of another flexible PCB of the invention, which has three different colors presented on the entire printing ink layer.

Additionally, the identifiable area on the flexible PCB 306 could present multiple colors. FIG. 6 is a top view of another flexible PCB of the invention, which has three different colors presented on the entire printing ink layer. In FIG. 6, the identifiable areas 602, 604, and 606 on the printing ink layer 310 present the colors of yellow (Y), magenta (M), and cyan (C), respectively. This color flexible PCB can be correctly assembled to the cartridge containing Y-M-C color inks. The colorants of yellow, magenta, and cyan are respectively added in the liquid photo imagerable polymer and coated on the identifiable areas 602, 604, and 606 on the printing ink layer 310, and then exposed, developed, and followed by post-curing to harden the rest of the printing ink layer 310. Also, the trademark and serial number could be formed on the flexible PCB 316 of FIG. 6. Similarly, the presented color areas on the printing ink layer 310 are not limited but identifiable.

Figure 7:
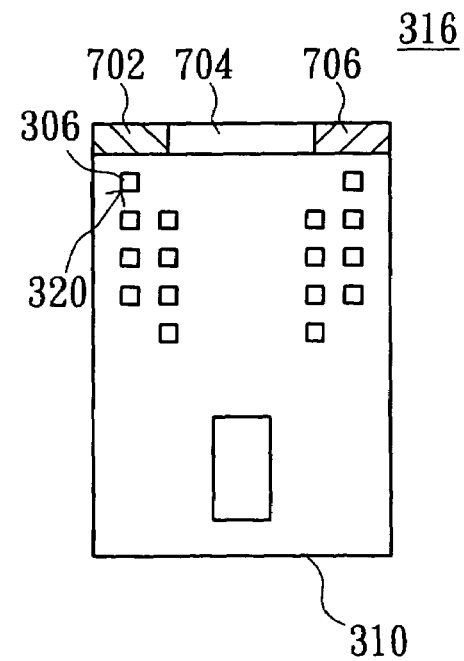
FIG. 7 is a top view of another flexible PCB of the invention, which has three different colors presented on parts of the printing ink layer.

In FIG. 7, a top view of another flexible PCB of the invention shows three different colors presented on parts of the printing ink layer. The identifiable areas 702, 704, and 706 on the upper end of the printing ink layer 310 present the colors of yellow (Y), magenta (M), and cyan (C), respectively. In the fabrication of flexible PCB, the colorants of yellow, magenta, and cyan are respectively added in the liquid photo imagerable polymer and coated on the identifiable areas 702, 704, and 706 on the printing ink layer 310, and then exposed, developed, and followed by post-curing to harden the rest of the printing ink layer 310. Also, the trademark and serial number could be formed on the flexible PCB 316 of FIG. 7.

In summary, the identifiable PCB can be correctly assembled to the cartridge. The flexible PCB comprises a flexible substrate, a plurality of conductive traces, and a printing ink layer. The printing ink layer is made of the liquid photo imagerable polymer, and the conductive layer (conductive traces) is formed on the flexible substrate. The printing ink layer is coated on the flexible substrate, and then exposed and developed, to form at least one identifiable area, and parts of the conductive layer are uncovered. At least one colorant is added in the identifiable area, wherein the identifiable area could be equal to the entire or parts of the printing ink layer. Also, other identifiable marks, such as trademark, brand name and serial number, could be further shown on the flexible PCB by forming a predetermined pattern on the printing ink layer.

According to the preferred embodiment of the invention, the fabrication method of forming the flexible PCB has several advantages. First of all, with the identifiable area design on the printing ink layer, it is very convenient for the on-line operators to assemble the flexible PCB and the cartridge. Second, other identifiable marks, such as the trademark, brand name and serial number, can be further formed on the printing ink layer, so that the conventional step of printing is eliminated and the mark does not easily peel off. Additionally, the cycle time for fabricating the flexible PCB of the invention is shortened, and the yield rate is raised to about 99%. Furthermore, the resolution of printer is increased. Therefore, the invention is well suited for the mass-production scale.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating an identifiable flexible printed circuit board (PCB) for use with an inkjet cartridge, the method comprising the steps of:
   providing a flexible substrate having a first surface;
   forming a conductive layer on the first surface of the flexible substrate;
   forming a patterned photo-resist layer over the conductive layer, and forming a conductive pattern from the conductive layer according to the patterned photo-resist layer;
   coating a printing ink layer on the first surface of the flexible substrate to cover the conductive pattern; and
   exposing and developing the printing ink layer to uncover parts of the conductive pattern and to form at least one identifiable area on the printing ink layer.

2. The method of fabricating flexible PCB according to claim 1, further comprising the step of:
   adding at least one colorant into the printing ink layer to form the color of the identifiable area.

3. The method of fabricating flexible PCB according to claim 1, wherein the color of the colorant added in the printing ink layer is selected from the groups consisting of black, cyan, magenta, yellow, light black, light cyan, light magenta, light yellow, orange, green, light orange, and light green.

4. The method of fabricating flexible PCB according to claim 1, wherein the identifiable area comprises an identifiable mark.

5. The method of fabricating flexible PCB according to claim 4, wherein the identifiable mark is a marking of a name of manufactured serial number.

6. The method of fabricating flexible PCB according to claim 1, wherein the material of the printing ink layer is a liquid photo imagerable polymer.

7. The method of fabricating flexible PCB according to claim 6, wherein the liquid photo imagerable polymer is solder mask.

8. The method of fabricating flexible PCB according to claim 6, wherein the liquid photo imagerable polymer is polyimide (PI).

9. The method of fabricating flexible PCB according to claim 1, wherein the printing ink layer is formed by a method selected from the groups consisting of screening printing, spray coating, curtain coating, and roller coating.

10. The method of fabricating flexible PCB according to claim 1 further comprising the step of:

post-curing the printing ink layer after forming the identifiable area.

11. The method of fabricating flexible PCB according to claim 1, wherein the material of the flexible substrate comprises at least one of polyimide (PI), Teflon, polyamide, polymethylmethacrylate, polycarbonate, polyester, and polyamide polyethylene-terephthalate copolymer.

12. The method of fabricating flexible PCB according to claim 1, wherein the conductive layer is attached to the first surface of the flexible substrate by an adhesive layer.

13. The method of fabricating flexible PCB according to claim 1, further comprising the steps of:

forming a photo-resist layer on the conductive layer; and
exposing and developing the photo-resist layer to form the patterned photo-resist layer.

14. The method of fabricating flexible PCB according to claim 1, further comprising the step of removing the patterned photo-resist layer after forming the conductive pattern.

* * * * *